(12) United States Patent
Watanabe et al.

(10) Patent No.: US 12,222,409 B2
(45) Date of Patent: Feb. 11, 2025

(54) INSPECTION APPARATUS AND METHOD FOR INSPECTING MAGNETIC SENSOR

(71) Applicant: TDK CORPORATION, Tokyo (JP)

(72) Inventors: Kazuya Watanabe, Tokyo (JP); Hiraku Hirabayashi, Tokyo (JP)

(73) Assignee: TDK CORPORATION, Tokyo (JP)

(*) Notice: Subject to any disclaimer, the term of this patent is extended or adjusted under 35 U.S.C. 154(b) by 173 days.

(21) Appl. No.: 17/981,838

(22) Filed: Nov. 7, 2022

(65) Prior Publication Data

US 2023/0152396 A1 May 18, 2023

(30) Foreign Application Priority Data

Nov. 12, 2021 (JP) .................... 2021-185095

(51) Int. Cl.
| | | |
|---|---|---|
| G01R 33/00 | (2006.01) | |
| G01B 7/14 | (2006.01) | |
| G01B 7/30 | (2006.01) | |
| G01R 15/20 | (2006.01) | |
| G01R 19/00 | (2006.01) | |
| G01R 33/09 | (2006.01) | |

(52) U.S. Cl.
CPC .................... *G01R 33/09* (2013.01)

(58) Field of Classification Search
CPC ........ G01R 33/00; G01R 33/09; G01R 15/20; G01R 19/00; G01B 7/14; G01B 7/30
See application file for complete search history.

(56) References Cited

U.S. PATENT DOCUMENTS

| | | | |
|---|---|---|---|
| 9,852,832 B2* | 12/2017 | Sirohiwala | G01R 33/07 |
| 2010/0265176 A1* | 10/2010 | Olsson | G06F 3/016 |
| | | | 345/161 |
| 2012/0038351 A1* | 2/2012 | Saruki | G01D 5/145 |
| | | | 324/207.25 |

FOREIGN PATENT DOCUMENTS

JP 2021-67503 A 4/2021

* cited by examiner

*Primary Examiner* — Neel D Shah
(74) *Attorney, Agent, or Firm* — Oliff PLC

(57) ABSTRACT

An inspection apparatus includes a stage having a placing surface, a first magnetic field generator, and a second magnetic field generator. The first magnetic field generator is configured to be changeable in orientation and to singly generate a first magnetic field. The second magnetic field generator is configured to be changeable in orientation and to singly generate a second magnetic field. The first and second magnetic field generators are configured to cooperatively generate a composite magnetic field in cooperation.

14 Claims, 6 Drawing Sheets

INSPECTION APPARATUS AND METHOD FOR INSPECTING MAGNETIC SENSOR

CROSS REFERENCE TO RELATED APPLICATIONS

This application claims the benefit of Japanese Priority Patent Application No. 2021-185095 filed on Nov. 12, 2021, the entire contents of which are incorporated herein by reference.

BACKGROUND

The technology relates to an inspection apparatus for inspecting a magnetic sensor and a method for inspecting a magnetic sensor.

Magnetic sensors using magnetoresistive elements have been used for various applications in recent years. A system including a magnetic sensor may be intended to detect a magnetic field in a direction perpendicular to the surface of a substrate (hereinafter, referred to as a perpendicular magnetic field) using a magnetoresistive element provided on the substrate. In such a case, the perpendicular magnetic field can be detected by providing a soft magnetic body for converting the perpendicular magnetic field into a magnetic field in a direction parallel to the surface of the substrate or disposing the magnetoresistive element on an inclined surface formed on the substrate.

To ship magnetic sensors to the market, the output characteristics of the magnetic sensors need to be inspected during manufacturing or before shipment. In inspecting a magnetic sensor, the output characteristics of the magnetic sensor are inspected by applying a magnetic field simulating a magnetic field to be detected by the magnetic sensor to the magnetic sensor. If the magnetic sensor is configured to be able to detect a perpendicular magnetic field, the magnetic sensor needs to be inspected by applying a perpendicular magnetic field to the magnetic sensor.

JP 2021-67503 A discloses a magnetic sensor inspection apparatus including two symmetrical coils. This inspection apparatus optionally switches the directions of energization of the respective two coils using a relay, whereby a magnetic field is switched and generated in two directions, a Z direction and an X direction.

The output characteristics of a magnetic sensor include characteristics, such as linearity and hysteresis, obtainable from the output of the magnetic sensor when the magnetic field is continuously changed. However, the inspection apparatus disclosed in JP 2021-67503 A is not capable of continuously changing the magnetic field, and unable to inspect characteristics such as linearity and hysteresis.

SUMMARY

An inspection apparatus according to one embodiment of the technology is an inspection apparatus configured to apply a magnetic field to a magnetic sensor to inspect an output of the magnetic sensor. The inspection apparatus according to one embodiment of the technology includes a stage having a placing surface for the magnetic sensor to be placed on, and a first magnetic field generator and a second magnetic field generator each disposed at a predetermined distance from the placing surface in a direction perpendicular to the placing surface.

The first magnetic field generator is configured to be changeable in orientation and to singly generate a first magnetic field that is a magnetic field to be applied to the magnetic sensor and that is in a first direction oblique to the direction perpendicular to the placing surface. The second magnetic field generator is configured to be changeable in orientation and to singly generate a second magnetic field that is a magnetic field to be applied to the magnetic sensor and that is in a second direction oblique to the direction perpendicular to the placing surface. The first and second magnetic field generators are configured to cooperatively generate a composite magnetic field that is a magnetic field to be applied to the magnetic sensor and contains a component in a direction parallel to an imaginary plane perpendicular to the placing surface.

In the inspection apparatus according to one embodiment of the technology, the first and second magnetic field generators may be configured to cooperatively change a direction of the composite magnetic field so that an angle that the direction of the composite magnetic field forms with a direction parallel to the placing surface changes.

In the inspection apparatus according to one embodiment of the technology, a relative position of each of the first and second magnetic field generators with respect to the magnetic sensor may be changeable.

In the inspection apparatus according to one embodiment of the technology, each of the first and second magnetic field generators may be a magnet. In such a case, an N pole and an S pole of the magnet may be arranged in a direction oblique to the direction perpendicular to the placing surface.

In the inspection apparatus according to one embodiment of the technology, the magnetic sensor may include a substrate having a main surface that is a flat surface, and a magnetic detection element. The magnetic detection element may be configured to detect a target magnetic field containing a component in a direction perpendicular to the main surface. The magnetic sensor may be placed on the placing surface so that the main surface is parallel to the placing surface.

A method for inspecting a magnetic sensor according to one embodiment of the technology includes: placing the magnetic sensor on a placing surface of a stage; disposing a first magnetic field generator at a predetermined distance from the placing surface in a direction perpendicular to the placing surface, the first magnetic field generator being configured to be changeable in orientation and to singly generate a first magnetic field that is a magnetic field to be applied to the magnetic sensor and that is in a first direction oblique to the direction perpendicular to the placing surface; disposing a second magnetic field generator at a predetermined distance from the placing surface in the direction perpendicular to the placing surface, the second magnetic field generator being configured to be changeable in orientation and to singly generate a second magnetic field that is a magnetic field to be applied to the magnetic sensor and that is in a second direction oblique to the direction perpendicular to the placing surface; operating the first and second magnetic field generators in a cooperative manner to generate a composite magnetic field that is a magnetic field to be applied to the magnetic sensor and contains a component in the direction perpendicular to the placing surface; and inspecting an output of the magnetic sensor.

The method for inspecting the magnetic sensor according to one embodiment of the technology may include operating the first and second magnetic field generators in a cooperative manner to change a direction of the composite magnetic field so that an angle that the direction of the composite magnetic field forms with a direction parallel to the placing surface changes.

The method for inspecting the magnetic sensor according to one embodiment of the technology may include changing a relative position of each of the first and second magnetic field generators with respect to the magnetic sensor.

In the method for inspecting the magnetic sensor according to one embodiment of the technology, each of the first and second magnetic field generators may be a magnet. In such a case, the method for inspecting the magnetic sensor according to one embodiment of the technology may include disposing the first and second magnetic field generators so that an N pole and an S pole of the magnet are arranged in a direction oblique to the direction perpendicular to the placing surface.

In the method for inspecting the magnetic sensor according to one embodiment of the technology, the magnetic sensor may include a substrate having a main surface that is a flat surface, and a magnetic detection element. The magnetic detection element may be configured to detect a target magnetic field containing a component in a direction perpendicular to the main surface. In such a case, the method for inspecting the magnetic sensor according to one embodiment of the technology may include placing the magnetic sensor on the placing surface so that the main surface is parallel to the placing surface.

In the inspection apparatus according to one embodiment of the technology, the first and second magnetic field generators are configured to cooperatively generate the composite magnetic field. The first and second magnetic field generators can each be changed in orientation. According to one embodiment of the technology, an inspection apparatus that can continuously change a magnetic field can thus be achieved.

In the method for inspecting the magnetic sensor according to one embodiment of the technology, the first and second magnetic field generators are operated in a cooperative manner to generate the composite magnetic field. The first and second magnetic field generators can each be changed in orientation. According to one embodiment of the technology, an inspection method that can continuously change a magnetic field can thus be achieved.

Other and further objects, features, and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings show example embodiments and, together with the specification, serve to explain the principles of the technology.

DETAILED DESCRIPTION

Figure 1:
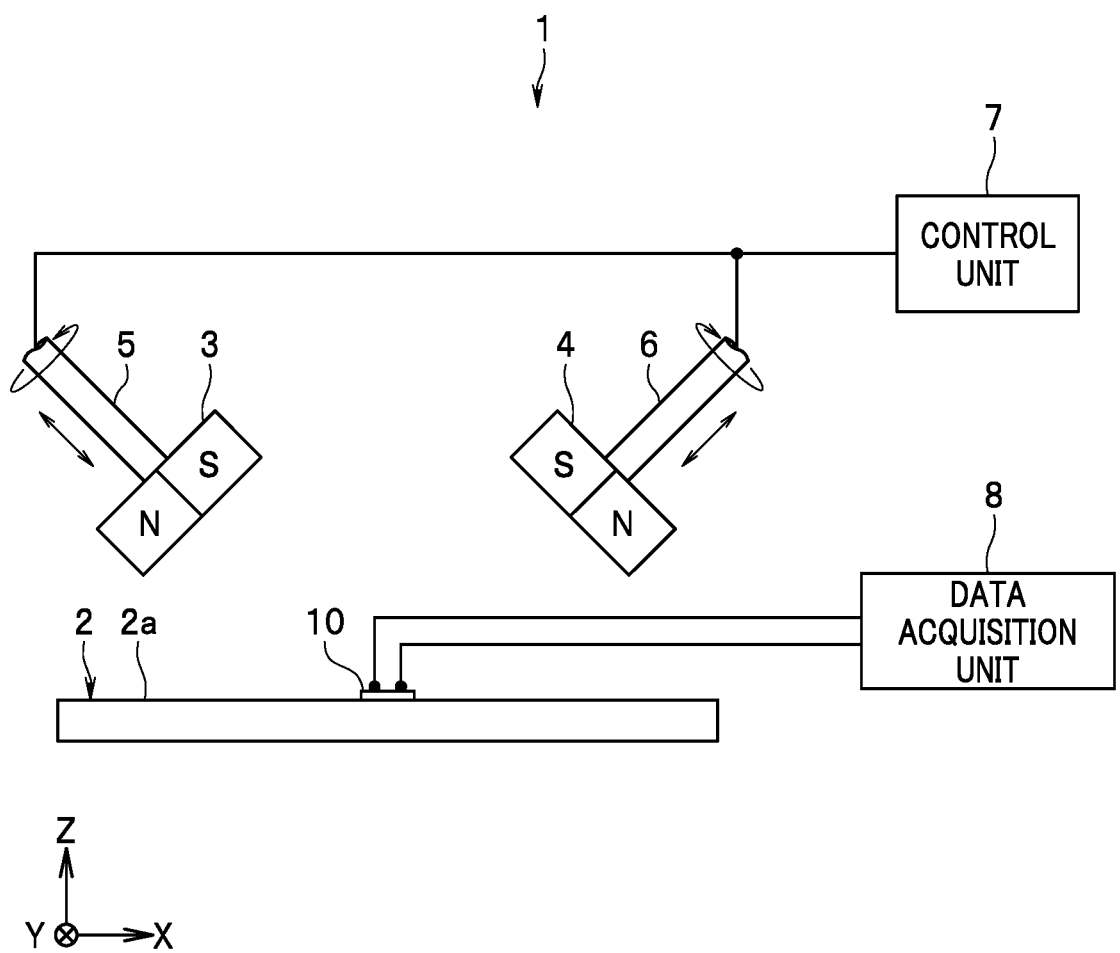
FIG. 1 is an explanatory diagram showing an overall configuration of an inspection apparatus according to an example embodiment of the technology.

An object of the technology is to provide an inspection apparatus that can continuously change a magnetic field, and a method for inspecting a magnetic sensor.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

Figure 2:
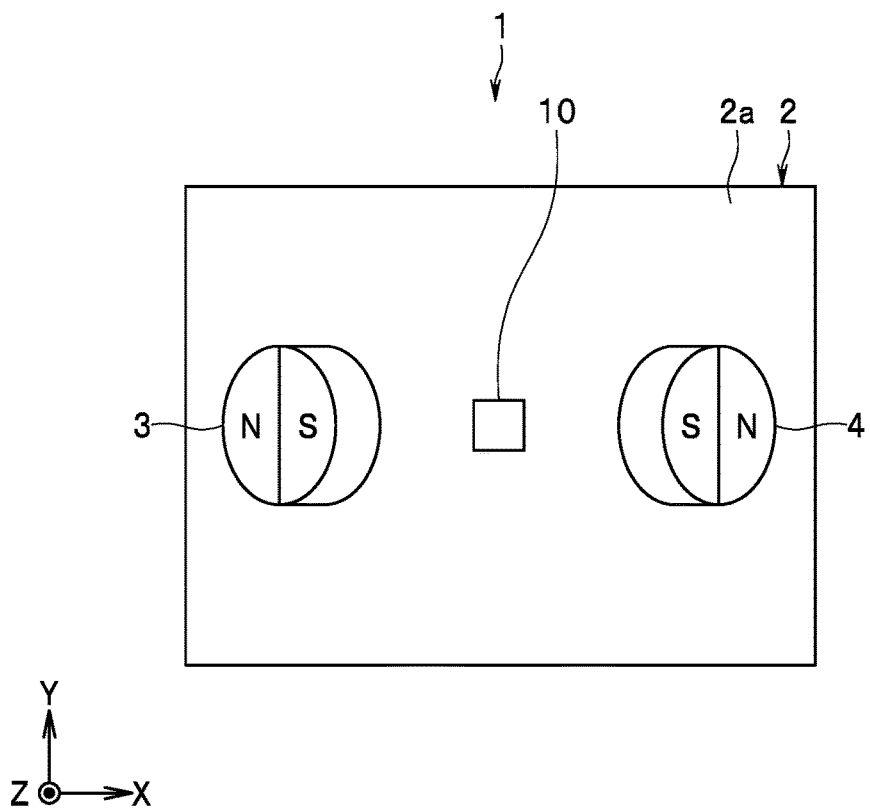
FIG. 2 is a plan view showing an essential part of the inspection apparatus according to the example embodiment of the technology.
Figure 3:
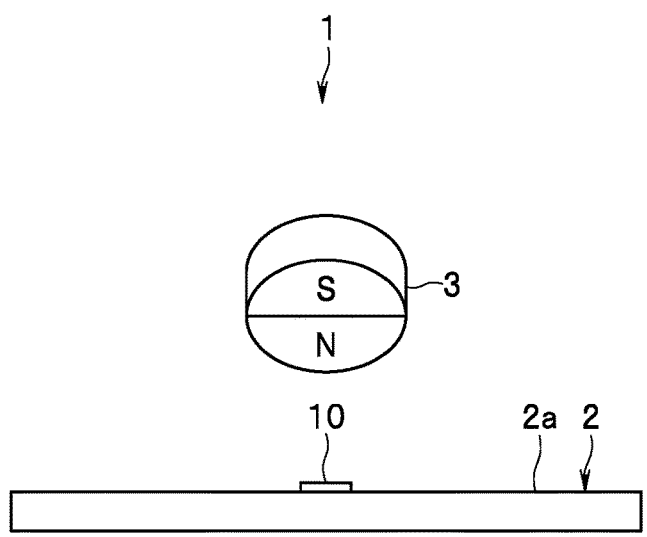
FIG. 3 is a side view showing the essential part of the inspection apparatus according to the example embodiment of the technology.

First, a configuration of an inspection apparatus 1 according to an example embodiment of the technology will be described with reference to FIGS. 1 to 3. FIG. 1 is an explanatory diagram showing an overall configuration of the inspection apparatus 1. FIG. 2 is a plan view showing an essential part of the inspection apparatus 1. FIG. 3 is a side view showing the essential part of the inspection apparatus 1.

The inspection apparatus 1 according to the example embodiment is an apparatus configured to apply a magnetic field to a magnetic sensor to inspect an output of the magnetic sensor. As shown in FIGS. 1 to 3, the inspection apparatus 1 includes a stage 2, a first magnetic field generator 3, and a second magnetic field generator 4.

The stage 2 has a placing surface 2a for a magnetic sensor to be placed on. In FIGS. 1 to 3, a reference numeral 10 denotes an object to be inspected. The object to be inspected 10 is placed on the placing surface 2a. The object to be inspected 10 may be a wafer including a plurality of undivided magnetic sensors or a diced magnetic sensor chip.

Now, we define X, Y, and Z directions as shown in FIGS. 1 to 3. The X, Y, and Z directions are orthogonal to one another. As employed in the present application, "orthogonal" is a concept that covers not only being perfectly orthogonal at 90° but also being substantially orthogonal, i.e., orthogonal with a slight deviation from 90°. In the present example embodiment, a direction (in FIG. 1, upward direction) perpendicular to the placing surface 2a of the stage 2 will be referred to as the Z direction. The X and Y directions are both directions parallel to the placing surface 2a of the stage 2. The opposite directions to the X, Y, and Z directions will be referred to as —X, —Y, and —Z directions, respectively. As used herein, the term "above" refers to positions located forward of a reference position in the Z direction, and "below" refers to positions located on a side of the reference position opposite to "above".

The first magnetic field generator 3 and the second magnetic field generator 4 are each disposed at a predetermined distance from the placing surface 2a in a direction parallel to the Z direction. In particular, in the present example embodiment, the first and second magnetic field generators 3 and 4 are both disposed above the placing surface 2a. The first magnetic field generator 3 is disposed forward of the object to be inspected 10 in the —X direction. The second magnetic field generator 4 is disposed forward of the object to be inspected 10 in the X direction.

The first magnetic field generator 3 is configured to singly generate a first magnetic field that is a magnetic field to be applied to the magnetic sensor, i.e., the object to be inspected 10. The first magnetic field is in a first direction oblique to the direction parallel to the Z direction. The second magnetic field generator 4 is configured to singly generate a second magnetic field that is a magnetic field to be applied to the magnetic sensor, i.e., the object to be inspected 10. The second magnetic field is in a second direction oblique to the direction parallel to the Z direction.

In particular, in the present example embodiment, each of the first and second magnetic field generators 3 and 4 is a magnet. The magnets may have a cylindrical shape. In such a case, the cylindrical magnet constituting the first magnetic field generator 3 and the cylindrical magnet constituting the second magnetic field generator 4 are disposed in a symmetrical orientation about a YZ plane intersecting the object to be inspected 10. The cylindrical magnets each have an N pole and an S pole located symmetrically about an imaginary plane including the center axis of the cylinder. The center axis of the cylinder is oblique to the direction parallel to the Z direction. The N and S poles of each cylindrical magnet are arranged in a direction oblique to the direction parallel to the Z direction.

The first and second magnetic field generators 3 and 4 are each configured so that their orientation can be changed. Specifically, the inspection apparatus 1 further includes a control unit 7 that controls the orientation of each of the first and second magnetic field generators 3 and 4. The first and second magnetic field generators 3 and 4 are connected to columnar support members 5 and 6, respectively, that are coupled to not-shown driving devices such as a motor. The control unit 7 controls the not-shown driving devices. The orientation of each of the first and second magnetic field generators 3 and 4 is thereby changed.

"Change of Orientation" covers a case where the orientation of each of the first and second magnetic field generators 3 and 4 is changed without changing the orientation of each of the first and second magnetic field generators 3 and 4 with respect to the object to be inspected 10 and a case where the orientation of each of the first and second magnetic field generators 3 and 4 is changed while changing the orientation of each of the first and second magnetic field generators 3 and 4 with respect to the object to be inspected 10. Suppose, for example, that the magnet constituting the first magnetic field generator 3 and the magnet constituting the second magnetic field generator 4 are rotated by the control unit 7 axially rotating the respective support members 5 and 6. In such a case, the orientation of each of the magnets constituting the first and second magnetic field generators 3 and 4 with respect to the object to be inspected 10 does not change. Suppose, for example, that the direction of the magnet constituting the first magnetic field generator 3 and the direction of the magnet constituting the second magnetic field generator 4 are changed by the control unit 7 rotating the support members 5 and 6 about respective axes parallel to the Y direction. In such a case, the orientation of each of the first and second magnetic field generators 3 and 4 with respect to the object to be inspected 10 changes.

The relative position of each of the first and second magnetic field generators 3 and 4 with respect to the magnetic sensor, i.e., the object to be inspected 10 can also be changed. Specifically, for example, the relative position may be changed by the control unit 7 moving the support members 5 and 6 in a predetermined direction. The predetermined direction may be at least one of the axial directions of the respective support members 5 and 6, a direction parallel to the X direction, and the direction parallel to the Z direction. The relative position may be changed by moving the stage 2 in a predetermined direction.

The first and second magnetic field generators 3 and 4 are configured to cooperatively generate a composite magnetic field that is a magnetic field to be applied to the magnetic sensor, i.e., the object to be inspected 10. The composite magnetic field contains a component in a direction parallel to an imaginary plane perpendicular to the placing surface 2a. In particular, in the present example embodiment, the imaginary plane is a plane parallel to the YZ plane.

The inspection apparatus 1 further includes a data acquisition unit 8. The data acquisition unit 8 is configured to apply a predetermined magnitude of power supply voltage to the magnetic sensor and receive an input of a detection signal output from the magnetic sensor. The magnetic sensor and the data acquisition unit 8 are electrically connected to each other via a plurality of lines.

Figure 4:
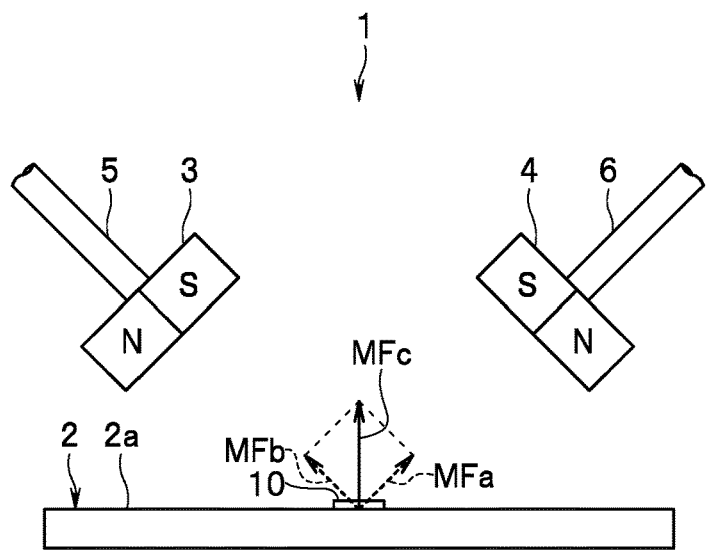
FIG. 4 is an explanatory diagram for describing an operation of the inspection apparatus according to the example embodiment of the technology.
Figure 5:
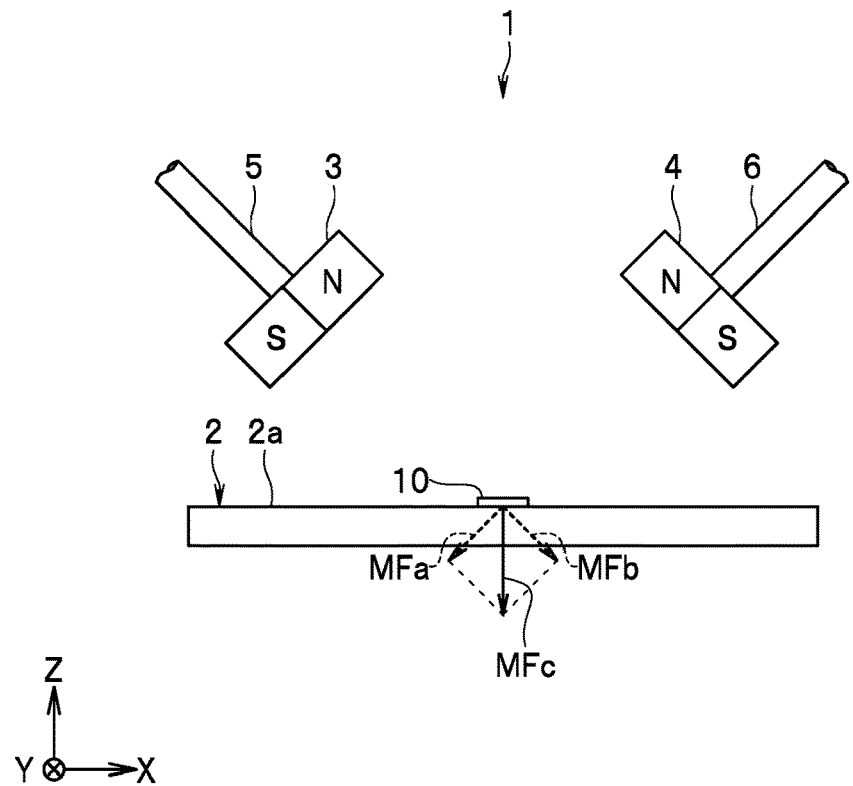
FIG. 5 is an explanatory diagram for describing the operation of the inspection apparatus according to the example embodiment of the technology.
Figure 6:
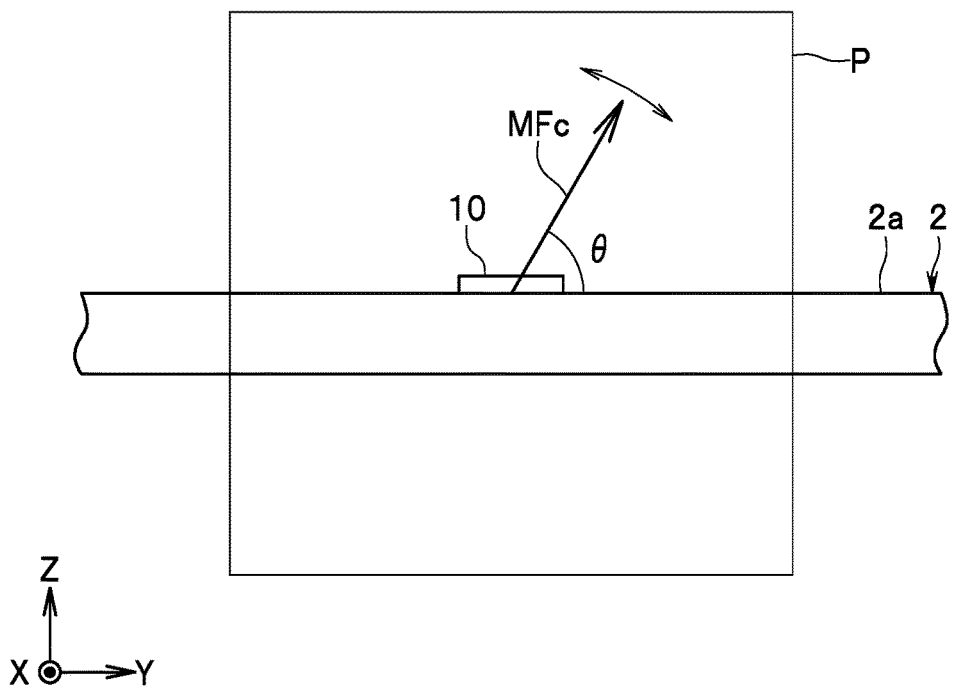
FIG. 6 is an explanatory diagram for describing a composite magnetic field according to the example embodiment of the technology.

Next, an operation of the inspection apparatus 1 and the composite magnetic field will be described in detail with reference to FIGS. 4 to 6. FIGS. 4 and 5 are explanatory diagrams for describing the operation of the inspection apparatus 1. FIG. 6 is an explanatory diagram for describing the composite magnetic field. In FIGS. 4 and 5, an arrow denoted by the reference symbol MFa represents the first magnetic field, and an arrow denoted by the reference symbol MFb the second magnetic field. In FIG. 6, the reference symbol P denotes the imaginary plane intersecting the object to be inspected 10 and parallel to the YZ plane.

FIG. 4 shows a state where the N and S poles of the magnet constituting the first magnetic field generator 3 are arranged in a direction tilted from the Z direction toward the X direction, and the N and S poles of the magnet constituting the second magnetic field generator 4 are arranged in a direction tilted from the Z direction toward the —X direction. In such a state, the direction of the first magnetic field MFa, i.e., the first direction is a direction tilted from the Z direction toward the X direction. The direction of the second magnetic field MFb, i.e., the second direction is a direction tilted from the Z direction toward the —X direction.

The first magnetic field MFa is the magnetic field generated by the first magnetic field generator 3 alone. The second magnetic field MFb is the magnetic field generated by the second magnetic field generator 4 alone. The direction of the first magnetic field MFa shown in FIG. 4 is that on the assumption that there is no second magnetic field generator 4. The direction of the second magnetic field MFb shown in FIG. 4 is that on the assumption that there is no first magnetic field generator 3. In fact, the first and second magnetic field generators 3 and 4 cooperatively generate a composite magnetic field MFc. The composite magnetic field MFc corresponds to a magnetic field obtained by combining the first and second magnetic fields MFa and MFb. For the sake of convenience, in FIG. 4, the composite magnetic field MFc is shown as a combined magnetic field of the first and second magnetic fields MFa and MFb.

The composite magnetic field MFc is applied to the magnetic sensor, i.e., the object to be inspected 10. The composite magnetic field MFc contains a component in a direction parallel to the imaginary plane P. The component in the direction parallel to the imaginary plane P may be a main component of the composite magnetic field MFc. Alternatively, the composite magnetic field MFc may be free of a component in a direction perpendicular to the imaginary plane P. For the sake of convenience, in the following description, the composite magnetic field MFc shall contain only a component in a direction parallel to the imaginary plane P and no component in the direction perpendicular to the imaginary plane P. In the state shown in FIG. 4, the direction of the composite magnetic field MFc is the Z direction.

FIG. 5 shows a state where the magnet constituting the first magnetic field generator 3 and the magnet constituting the second magnetic field generator 4 are each rotated 180° from the state shown in FIG. 4. In such a state, the N and S poles of the magnet constituting the first magnetic field generator 3 are arranged in a direction tilted from the —Z direction toward the —X direction, and the N and S poles of the magnet constituting the second magnetic field generator 4 are arranged in a direction tilted from the —Z direction toward the X direction. In such a state, the direction of the first magnetic field MFa, i.e., the first direction is a direction tilted from the —Z direction toward the —X direction. The direction of the second magnetic field MFb, i.e., the second direction is a direction tilted from the —Z direction toward the X direction. The direction of the composite magnetic field MFc is the —Z direction.

As shown in FIGS. 4 and 5, the direction of the composite magnetic field MFc changes as the orientation of each of the first and second magnetic field generators 3 and 4 is changed. In FIG. 6, the symbol θ represents the angle that the direction of the composite magnetic field MFc forms with respect to the Y direction. The first and second magnetic field generators 3 and 4 are configured to cooperatively change the direction of the composite magnetic field MFc so that the angle θ changes. In the example embodiment, the direction of the first magnetic field MFa rotates as the magnet constituting the first magnetic field generator 3 is rotated. The direction of the second magnetic field MFb rotates as the magnet constituting the second magnetic field generator 4 is rotated. As a result, the direction of the composite magnetic field MFc rotates. The angle θ changes within the range of 0° or more and not more than 360°. The direction-rotating composite magnetic field MFc is applied to the object to be inspected 10 as a rotating magnetic field.

Next, first and second examples of the magnetic sensor will be described. First, the first example of the magnetic sensor will be described with reference to FIG. 7. A magnetic sensor 20 shown in FIG. 7 includes a substrate 21 having a main surface 21a that is a flat surface, and a magnetic detection element 22.

The magnetic detection element 22 is configured to detect a target magnetic field that is a magnetic field to be detected by the magnetic sensor 20 and contains a component in a direction perpendicular to the main surface 21a. In the first example, the substrate 21 further has a groove portion 21c open in the main surface 21a. The groove portion 21c includes an inclined surface 21b inclined with respect to the main surface 21a. The inclined surface 21b may be a flat surface or a curved surface. The magnetic detection element 22 is disposed on the inclined surface 21b.

If the magnetic sensor 20 is inspected using the inspection apparatus 1 shown in FIGS. 1 to 3, the magnetic sensor 20 is placed on the placing surface 2a so that the main surface 21a is parallel to the placing surface 2a. Hereinafter, the magnetic sensor 20 will also be described by using the X, Y, and Z directions shown in FIGS. 1 to 3. The main surface 21a is a flat surface parallel to an XY plane. The component of the target magnetic field in the direction perpendicular to the main surface 21a is a component in the direction parallel to the Z direction.

A direction rotated from the Z direction to the —X direction by α will be referred to as a U direction. A direction opposite to the U direction will be referred to as a —U direction. The inclined surface 21b may be a flat surface parallel to a UY plane.

The magnetic detection element 22 may be a spin-valve magnetoresistive element or an anisotropic magnetoresistive element. A magnetoresistive element will hereinafter be referred to as an MR element. In the example shown in FIG. 7, the magnetic detection element 22 is a spin-valve MR element. The spin-valve MR element includes a magnetization pinned layer whose magnetization direction is fixed, and a free layer whose magnetization direction is variable, and a nonmagnetic layer disposed between the magnetization pinned layer and the free layer. The spin-valve MR element may be a tunnel magnetoresistive (TMR) element or a giant magnetoresistive (GMR) element. The nonmagnetic layer of the TMR element is a tunnel barrier layer. The nonmagnetic layer of the GMR element is a nonmagnetic conductive layer.

Figure 7:
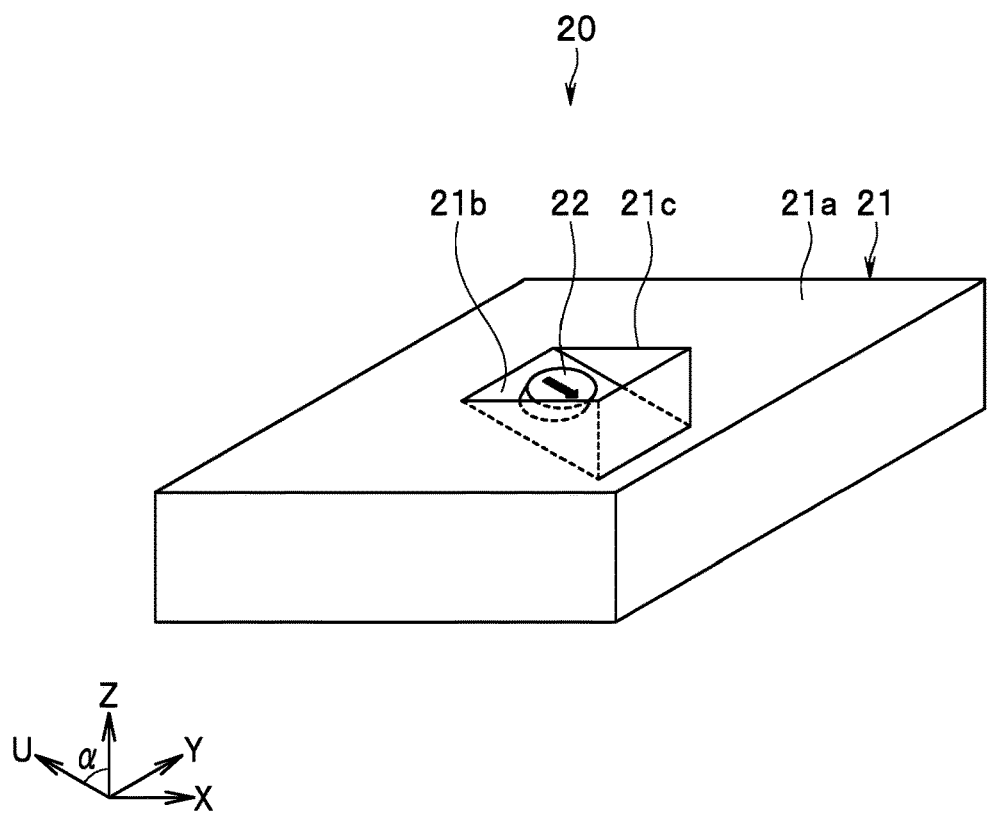
FIG. 7 is a perspective view showing a first example of a magnetic sensor to be inspected by the inspection apparatus according to the example embodiment of the technology.

The spin-valve MR element changes in resistance with the angle that the magnetization direction of the free layer forms with respect to the magnetization direction of the magnetization pinned layer. The resistance is minimized when the angle is 0°. The resistance is maximized when the angle is 180°. In FIG. 7, the solid arrow indicates the magnetization direction of the magnetization pinned layer. In the example shown in FIG. 7, the magnetization direction of the magnetization pinned layer is the —U direction.

The target magnetic field may be a magnetic field whose direction rotates within an imaginary plane parallel to the YZ plane. In such a case, the target magnetic field contains a component in a direction parallel to the Y direction in addition to a component in the direction parallel to the Z direction. Suppose that the target magnetic field is divided into an in-plane component that is a component parallel to the UY plane, and a perpendicular component that is a component perpendicular to the UY plane. The direction of the in-plane component changes with the direction of the target magnetic field. The magnetization direction of the free layer changes with the direction of the in-plane component. The resistance of the magnetic detection element 22, i.e., the MR element changes with the direction of the in-plane component. The magnetic sensor 20 outputs a signal corresponding to the resistance of the MR element as a detection signal.

Figure 8:
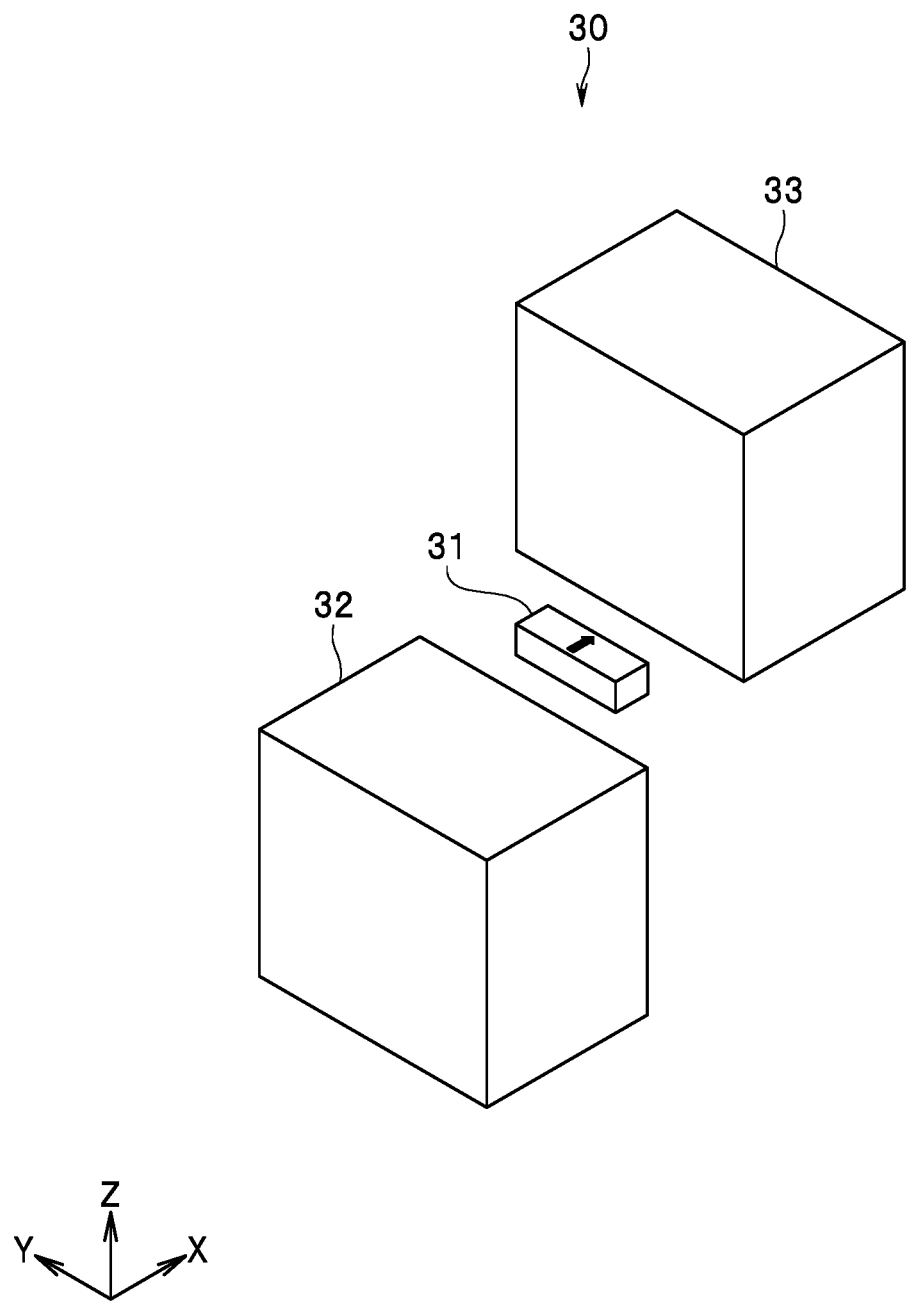
FIG. 8 is a perspective view showing a second example of the magnetic sensor to be inspected by the inspection apparatus according to the example embodiment of the technology.

Next, the second example of the magnetic sensor will be described with reference to FIG. 8. A magnetic sensor 30 shown in FIG. 8 includes a not-shown substrate having a main surface that is a flat surface, and a magnetic detection element 31. If the magnetic sensor 30 is inspected using the inspection apparatus 1 shown in FIGS. 1 to 3, the magnetic sensor 30 is placed on the placing surface 2a so that the main surface of the not-shown substrate is parallel to the placing surface 2a. Hereinafter, the magnetic sensor 30 will also be described by using the X, Y, and Z directions shown in FIGS. 1 to 3. The main surface of the not-shown substrate is a flat surface parallel to the XY plane.

The magnetic detection element 31 is disposed above the main surface of the not-shown substrate. In the example shown in FIG. 8, the magnetic detection element 31 is a spin-valve MR element. In FIG. 8, the solid arrow indicates the magnetization direction of the magnetization pinned layer of the spin-valve MR element. In the example shown in FIG. 8, the magnetization direction of the magnetization pinned layer is the X direction. The free layer has a shape anisotropy with the magnetization easy axis in the direction parallel to the Y direction.

The magnetic detection element 31 is configured to detect a target magnetic field that is the magnetic field to be detected by the magnetic sensor 30 and contains a component in a direction perpendicular to the main surface of the not-shown substrate, i.e., the direction parallel to the Z direction. In the second example, the magnetic sensor 30 further includes a lower yoke 32 and an upper yoke 33. The lower and upper yokes 32 and 33 are each formed of a soft magnetic material. The lower and upper yokes 32 and 33 each have a rectangular solid shape long in a direction perpendicular to the Z direction. The lower yoke 32 is disposed closer to the main surface of the not-shown substrate than is the magnetic detection element 31. The upper yoke 33 is disposed farther from the main surface of the not-shown substrate than is the magnetic detection element 31. When seen from above, the magnetic detection element 31 is disposed between the lower yoke 32 and the upper yoke 33.

The lower and upper yokes 32 and 33 receive a component of the target magnetic field in the Z direction, and output an output magnetic field component in the X direction. The lower and upper yokes 32 and 33 also receive a component of the target magnetic field in the —Z direction, and output an output magnetic field component in the —X direction. The resistance of the magnetic detection element 31, i.e., the MR element changes with the strength of the output magnetic field component. The strength of the output magnetic field components has a correspondence with the strength of the respective components in the Z and —Z directions. The magnetic sensor 30 outputs a signal corresponding to the resistance of the MR element as a detection signal.

Figure 9:
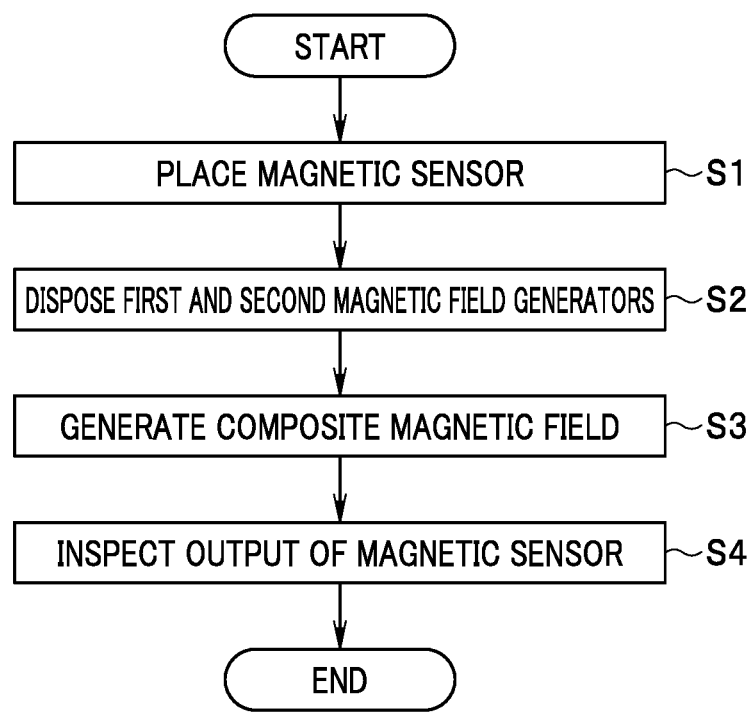
FIG. 9 is a flowchart showing an inspection method according to the example embodiment of the technology.

Next, a method for inspecting a magnetic sensor according to the example embodiment will be described with reference to FIGS. 1 and 9. FIG. 9 is a flowchart showing the method for inspecting a magnetic sensor. In the method for inspecting a magnetic sensor, first, the magnetic sensor, i.e., the object to be inspected 10 is placed on the placing surface 2a of the stage 2 (step S1). Next, the first and second magnetic field generators 3 and 4 are disposed at respective predetermined positions (step S2). Specifically, the magnet constituting the first magnetic field generator 3 and the magnet constituting the second magnetic field generator 4 are disposed at the respective predetermined positions.

Next, the control unit 7 controls the orientation and position of each of the first magnetic field generator 3 (magnet) and the second magnetic field generator 4 (magnet), whereby a composite magnetic field MFc having a predetermined direction and strength is generated (step S3). Next, the data acquisition unit 8 inspects the output of the magnetic sensor (step S4).

In step S4 of inspecting the output of the magnetic sensor, the first and second magnetic field generators 3 and 4 may be operated in a cooperative manner to change the direction of the composite magnetic field MFc so that the angle θ shown in FIG. 6 changes. The angle θ may be continuously changed within the range of 0° or more and not more than 360°. For example, the direction of the composite magnetic field MFc can be fixed at a predetermined angle θ like 0°, 90°, 180°, or 270°.

In step S4 of inspecting the output of the magnetic sensor, the output of the magnetic sensor may be inspected while changing the strength of the composite magnetic field MFc. The strength of the composite magnetic field MFc can be changed by changing the relative position of each of the first and second magnetic field generators 3 and 4 with respect to the magnetic sensor, i.e., the object to be inspected 10, or by changing the direction of the magnet constituting the first magnetic field generator 3 and the direction of the magnet constituting the second magnetic field generator 4.

If the object to be inspected 10 is a wafer including a plurality of undivided magnetic sensors, the plurality of magnetic sensors may be inspected either simultaneously or one by one in step S4 of inspecting the output of a magnetic sensor. If the magnetic sensors are inspected one by one, the positions of the first and second magnetic field generators 3 and 4 may be fixed during inspection. The magnetic sensors may be inspected while changing the relative position of each of the first and second magnetic field generators 3 and 4 with respect to the stage 2 from one magnetic sensor to another.

As described above, the inspection apparatus 1 and the method for inspecting a magnetic sensor according to the present example embodiment generate the composite magnetic field MFc to be applied to the magnetic sensor using the first and second magnetic field generators 3 and 4 that can be changed in orientation. According to the present example embodiment, the composite magnetic field MFc can thus be continuously changed.

The technology is not limited to the foregoing example embodiment, and various modification may be made thereto. For example, the shape of the magnet constituting each of the first and second magnetic field generators 3 and 4 is not limited to the circular cylindrical shape, and may be an elliptical cylindrical shape, a prismatic shape, or a bar shape. The first and second magnetic field generators 3 and 4 are not limited to magnets, either, and may be magnetic field generators including a coil.

Obviously, various modification examples and variations of the technology are possible in the light of the above teachings. Thus, it is to be understood that, within the scope of the appended claims and equivalents thereof, the technology may be practiced in other embodiments than the foregoing example embodiment.

What is claimed is:

1. An inspection apparatus configured to apply a magnetic field to a magnetic sensor to inspect an output of the magnetic sensor, the inspection apparatus comprising:
   a stage having a placing surface for the magnetic sensor to be placed on; and
   a first magnetic field generator and a second magnetic field generator each disposed at a predetermined distance from the placing surface in a direction perpendicular to the placing surface, wherein
   the first magnetic field generator is configured to be changeable in orientation and to singly generate a first magnetic field that is a magnetic field to be applied to the magnetic sensor and that is in a first direction oblique to the direction perpendicular to the placing surface, and configured to be rotatable in a direction about an axis of the first magnetic field generator oblique to the direction perpendicular to the placing surface, the second magnetic field generator is configured to be changeable in orientation and to singly generate a second magnetic field that is a magnetic field to be applied to the magnetic sensor and that is in a second direction oblique to the direction perpendicular to the placing surface, and configured to be rotatable in a direction about an axis of the second magnetic field generator oblique to the direction perpendicular to the placing surface, and the first and second magnetic field generators are configured to cooperatively generate a composite magnetic field that is a magnetic field to be applied to the magnetic sensor and contains a component in a direction parallel to an imaginary plane perpendicular to the placing surface.

2. The inspection apparatus according to claim 1, wherein the first and second magnetic field generators are configured to cooperatively change a direction of the composite magnetic field so that an angle that the direction of the composite magnetic field forms with a direction parallel to the placing surface changes.

3. The inspection apparatus according to claim 1, wherein a relative position of each of the first and second magnetic field generators with respect to the magnetic sensor is changeable.

4. The inspection apparatus according to claim 1, wherein each of the first and second magnetic field generators is a magnet.

5. The inspection apparatus according to claim 4, wherein an N pole and an S pole of the magnet are arranged in a direction oblique to the direction perpendicular to the placing surface.

6. The inspection apparatus according to claim 1, wherein:

the magnetic sensor includes a substrate having a main surface that is a flat surface, and a magnetic detection element;

the magnetic detection element is configured to detect a target magnetic field containing a component in a direction perpendicular to the main surface; and the magnetic sensor is placed on the placing surface so that the main surface is parallel to the placing surface.

7. The inspection apparatus according to claim 1, wherein:

the first magnetic field generator is configured to be movable in at least one of an axial direction of the first magnetic field generator, a direction parallel to the placing surface, and the direction perpendicular to the placing surface, and the second magnetic field generator is configured to be movable in at least one of an axial direction of the second magnetic field generator, the direction parallel to the placing surface, and the direction perpendicular to the placing surface.

8. The inspection apparatus according to claim 1, further comprising a control unit configured to control the orientation of each of the first magnetic field generator and the second magnetic field generator.

9. A method for inspecting a magnetic sensor comprising:

placing the magnetic sensor on a placing surface of a stage;

disposing a first magnetic field generator at a predetermined distance from the placing surface in a direction perpendicular to the placing surface, the first magnetic field generator being configured to be changeable in orientation and to singly generate a first magnetic field that is a magnetic field to be applied to the magnetic sensor and that is in a first direction oblique to the direction perpendicular to the placing surface, the first magnetic field generator being further configured to be rotatable in a direction about an axis of the first magnetic field generator oblique to the direction perpendicular to the placing surface;

disposing a second magnetic field generator at a predetermined distance from the placing surface in the direction perpendicular to the placing surface, the second magnetic field generator being configured to be changeable in orientation and to singly generate a second magnetic field that is a magnetic field to be applied to the magnetic sensor and that is in a second direction oblique to the direction perpendicular to the placing surface, the second magnetic field generator being further configured to be rotatable in a direction about an axis of the second magnetic field generator oblique to the direction perpendicular to the placing surface;

operating the first and second magnetic field generators in a cooperative manner to generate a composite magnetic field that is a magnetic field to be applied to the magnetic sensor and contains a component in the direction perpendicular to the placing surface; and inspecting an output of the magnetic sensor.

10. The method for inspecting a magnetic sensor according to claim 9, comprising operating the first and second magnetic field generators in a cooperative manner to change a direction of the composite magnetic field so that an angle that the direction of the composite magnetic field forms with a direction parallel to the placing surface changes.

11. The method for inspecting a magnetic sensor according to claim 9, comprising changing a relative position of each of the first and second magnetic field generators with respect to the magnetic sensor.

12. The method for inspecting a magnetic sensor according to claim 9, wherein:

each of the first and second magnetic field generators is a magnet; and the method comprises disposing the first and second magnetic field generators so that an N pole and an S pole of the magnet are arranged in a direction oblique to the direction perpendicular to the placing surface.

13. The method for inspecting a magnetic sensor according to claim 9, wherein:

the magnetic sensor includes a substrate having a main surface that is a flat surface, and a magnetic detection element;

the magnetic detection element is configured to detect a target magnetic field containing a component in a direction perpendicular to the main surface; and the method comprises placing the magnetic sensor on the placing surface so that the main surface is parallel to the placing surface.

14. The method for inspecting a magnetic sensor according to claim 9, wherein the first magnetic field generator is configured to be movable in at least one of an axial direction of the first magnetic field generator, a direction parallel to the placing surface, and the direction perpendicular to the placing surface, and the second magnetic field generator is configured to be movable in at least one of an axial direction of the second magnetic field generator, the direction parallel to the placing surface, and the direction perpendicular to the placing surface.

\* \* \* \* \*